United States Patent [19]

Yuska

[11] 3,759,559

[45] Sept. 18, 1973

[54] UNIVERSAL EXTRACTOR TOOL

[75] Inventor: Leonard J. Yuska, Greenwood, Ind.

[73] Assignee: The United States of America as represented by the Secretary of the Navy, Washington, D.C.

[22] Filed: July 10, 1972

[21] Appl. No.: 270,380

[52] U.S. Cl. .................. 294/15, 294/1 R, 29/203 H, 29/278

[51] Int. Cl. .................. B65g 7/12

[58] Field of Search .................. 294/15, 34, 26, 1 R, 294/110 A; 29/203 H

[56] References Cited

UNITED STATES PATENTS 3,484,129 12/1969 Askren .................. 294/15

*Primary Examiner*—Evon C. Blunk

*Assistant Examiner*—James L. Rowland

*Attorney*—R. S. Sciascia et al.

[57] ABSTRACT

A universal extractor tool having first and second U-shaped members attached together for relatively slidable movement in one direction and having a resilient cushion of non-metallic material positioned between said U-shaped members for providing first and second resistive forces when said U-shaped members are moved together. A puller plate is removably attached to one of said U-shaped members and means are provided on said puller plate for engaging a module board to be extracted from a mounting frame.

3 Claims, 3 Drawing Figures

PATENTED SEP 18 1973 3,759,559

UNIVERSAL EXTRACTOR TOOL

BACKGROUND OF THE INVENTION

The present invention relates to an extracting tool for removing a plug-in module board from a module mounting frame.

There is a constant demand for smaller electrical and electronic components, particularly in the aircraft and missile fields, as weight is of extreme importance. One concept of microelectronics which has been recently developed and which offers a great reduction in size and weight of electronic units is that of integrated circuitry which is formed on insulated bases such as glass, fused silica, or ceramic substrates. Integrated circuitry includes a number of active and passive components which are fabricated by one or more of a combination of several thin film deposition techniques onto a glass or ceramic substrate.

In order to reduce costs, expedite production, and provide a reliable electronic component, the Department of the Navy, as well as other military branches, have been engaged in a standard hardware program in which electronic plug-in modules have been developed which are capable of meeting various system requirements. Generally, a plug-in module is designed for high reliability and, whenever possible, have a cost which will permit them to be thrown away rather than be repaired. One such plug-in module is shown in U.S. Pat. No. 3,243,660, entitled "Electronic Module Assembly," which issued Mar. 29, 1966, to Leonard J. Yuska and David P. Zimmerman.

One concept of a standard hardware program is to have a plurality of modules which plug-in a chassis to form an assembly and normally these plug-in modules slide in grooves or ways in the chassis and engage a mating female connector. As the basic module connector consists of 40 metal bayonet pins, removal of a plug-in module from a chassis normally presents a problem, as any lateral movement could damage the small bayonet pins.

Various pulling tools or extractors have been devised to facilitate the removal of a plug-in module from a chassis, and these tools are designed so that an operator can withdraw the module with controlled force. One such device which has been developed for the Navy hardware program is shown in U.S. Pat. No. 3,180,670, entitled "Chassis Pulling Tool," which issued Apr. 27, 1965, to Thomas R. Pryde. In this chassis pulling tool, first and second U-shaped members are provided, with the legs of an inner U-shaped member being slidably mounted through holes in an outer U-shaped member. The legs of the inner U-shaped member are constructed and arranged so as to engage a plug-in module which is to be removed from a chassis.

While the chassis pulling tool of the above-mentioned patent permits an operator to easily withdraw a plug-in module from a chassis, the chassis pulling tool is lacking in universal application and will operate with only one specific design. In order to eliminate the necessity of having a multiple number of pulling tools of various sizes, a universal extractor tool was developed for the standard hardware program. This tool is shown and described in U.S. Pat. No. 3,484,129, entitled, "Universal Extractor Tool" which issued Dec. 16, 1969, to Sherman G. Askren. This patented universal extractor tool eliminates the necessity of having a multiple number of extracting tools, however, it has one disadvantage. It has been determined that an extraction force of about 27 pounds is required to remove some types of plug-in modules from a chassis and, when this force is applied by the extractor tool, there is a propensity for the module to accelerate violently upon release of contact pins from their sockets and to decelerate even more violently when the sliding portion of the tool reaches the tool stops. The reversed high G-force can be detrimental to the rather fragile module.

SUMMARY OF THE INVENTION

The present invention relates to an extractor tool for removing plug-in modules by applying a first force and then a second force greater than the first force. First and second U-shaped members are provided, each having a crossbar and first and second parallel legs. The size of the second U-shaped member is such that it fits within the first U-shaped member and is slidably attached thereto. A resilient cushion of non-metallic material is positioned between the two crossbars of the U-shaped member and this cushion is provided with a wide slot thereby forming an elongated oval shaped cushion. A relatively small force is required to move the second U-shaped member relatively to the first U-shaped member until the slot becomes closed and then a greater force is required for additional movement of the second U-shaped member relative to the first U-shaped member. A puller plate is attached to the second U-shaped member and is provided with means for engaging an electronic module.

It is therefore a general object of the present invention to provide a universal extractor tool for removing a plug-in module from a module assembly while preventing any accelerating forces which could damage the plug-in module.

Other objects and advantages of the present invention will be readily appreciated as the same becomes better understood by reference to the following detailed description when considered in connection with the accompanying drawing.

DESCRIPTION OF THE PREFERRED EMBODIMENT

Figure 1:
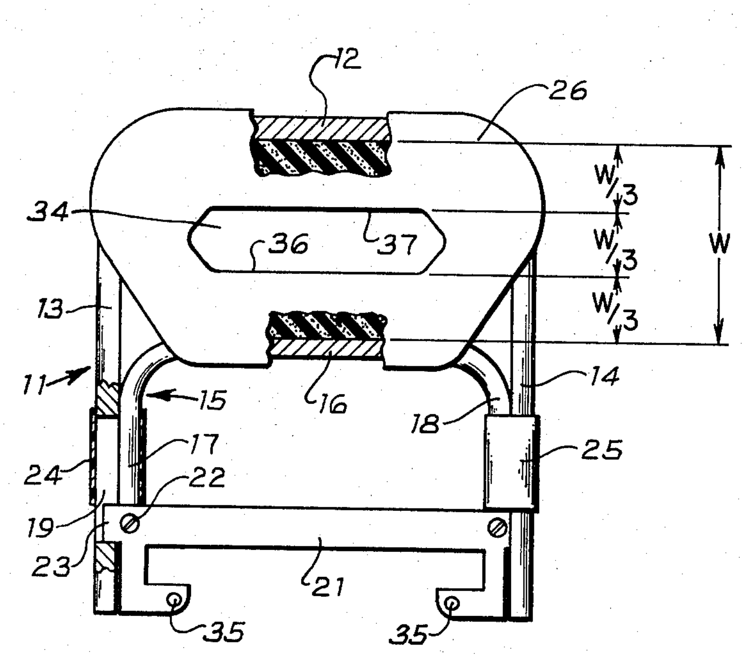
FIG. 1 is a front view, partially broken away, showing a preferred embodiment of the present invention.

Referring now to the drawing, there is shown a first U-shaped member 11 having a crossbar 12 and parallel legs 13 and 14, and a second U-shaped member 15, smaller in width than the first U-shaped member 11, having a crossbar 16 and parallel legs 17 and 18. Each leg 13 and 14 is provided with an elongated slot 19 and each leg 17 and 18 is notched to receive a puller plate 21. Puller plate 21 is attached to U-shaped member 15 by screws 22 and puller plate 21 is provided with a pair of oppositely extending ears 23 that slidably engage in elongated slots 19 in legs 17 and 18. Ears 23 secure member 15 to member 11 and permit relative movement in up and down directions parallel with the legs of the two members, however, additional securing is provided by plastic sleeving 24 and 25. Sleeving 24 surrounds legs 13 and 17 and sleeving 25 surrounds legs 14 and 18.

Figure 3:
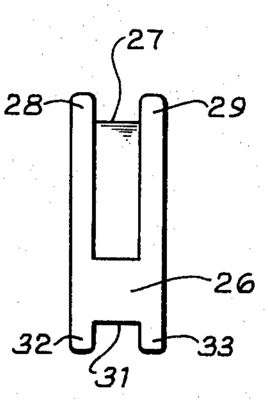
FIG. 3 is a side view of a resilient cushion.

A cushion 26 of resilient material, such as cellular rubber, is provided between crossbars 12 and 16 and biases the two U-shaped members 11 and 15 apart. As best shown in FIG. 3 of the drawing, cushion 26 is provided with a top groove 27 that forms flanges 28 and 29 and a bottom groove 31 that forms flanges 32 and 33. Groove 27 engages crossbar 12 and a portion of legs 13 and 14 and groove 31 engages a portion of crossbar 16 and the flanges maintain cushion 26 in position. An elongated hole 34 is provided in cushion 26 and adapts cushion 26 to provide first and second resistive forces when crossbar 16 is moved toward crossbar 12. As shown in FIG. 1 of the drawing the dimension W represents the distance between crossbars 12 and 16 and elongated hole 34 is centrally located in cushion 26 and has a width of ⅓ W.

Figure 2:
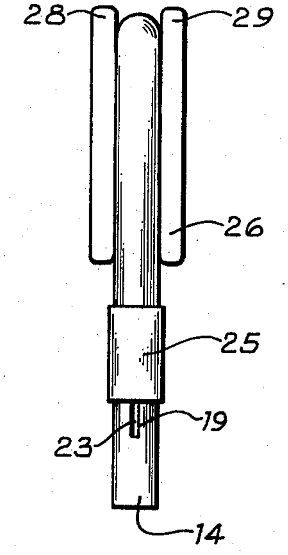
FIG. 2 is a side view of the embodiment shown in FIG. 1 of the drawing.

Referring to FIGS. 1 and 2 of the drawing, a pair of pins 35 are attached to puller plate 21 and are adaptable for engaging holes in a plug-in module. As more fully explained in the above-referenced U.S. Pat. No. 3,484,129, puller plate 21 may be of various configurations and different sizes and shapes of puller plates can be attached and removed by merely threading or unthreading screws 22, and without affecting the other parts of the extractor.

OPERATION

In operation, assuming a plug-in module is mounted in a chassis, the extractor tool of the present invention is positioned such that pins 35 engage holes in the plug-in module and the bottoms of legs 13 and 14 are positioned on the sides of the chassis. The extractor tool is gripped by an operator such that a palm of one hand is against the top of cushion 26 and crossbar 12 and two or more fingers engage the bottom of cushion 26 and crossbar 16. Upon squeezing of the fingers engaging crossbar 16, puller plate 21 which is attached to legs 17 and 18 moves upwardly toward crossbar 12 while legs 13 and 14 remain stationary. As U-shaped member 15 moves upwardly relative to U-shaped member 11, the plug-in module is withdrawn from its chassis and the bottom one-third portion of cushion 26 moves to close hole 34, that is, side 36 of hole 34 engages side 37. At this condition, the plug-in module will still be engaged with the chassis and cushion 26 will provide a much greater resistive force which will momentarily stop movement of U-shaped member 15. The operator will then need to exert a much greater force with his fingers in order to compress cushion 26 and continue movement of U-shaped member 15 until the plug-in module is removed from its chassis. This momentary stop in the movement of U-shaped member 15 which is caused by cushion 26 providing a second and greater resistive force, prevents any rapid withdrawing of the plug-in module from its chassis and damaging acceleration forces are prevented.

Obviously many modifications and variations of the present invention are possible in the light of the above teachings. It is therefore to be understood, that within the scope of the appended claims, the invention may be practiced otherwise than as specifically described.

I claim:

1. A universal extractor tool for removing an electronic module from a chassis comprising:

a first U-shaped member having a crossbar and first and second parallel legs each having an elongated slot therein, a second U-shaped member having a crossbar and first and second parallel legs, said second U-shaped member being smaller in width and height than said first U-shaped member, a puller plate removably attached to said second U-shaped member and having oppositely extending ears slidably engageable one each in each said elongated slot in said first U-shaped member, a resilient cushion of non-metallic material having a top groove forming a first pair of side flanges with said top groove engaging said crossbar of said first U-shaped member and a bottom groove forming a second pair of side flanges with said bottom groove engaging said crossbar of said second U-shaped member whereby said first and second pairs of side flanges retain said resilient cushion in position between said crossbars, said resilient cushion having means for providing first and second resistive forces when said crossbar of said second U-shaped member is moved toward said crossbar of said first U-shaped member, and means on said puller plate for attaching said puller plate to an electronic module.

2. A universal extractor tool as set forth in claim 1 wherein said means in said resilient cushion for providing first and second resistive forces comprises a centrally located elongated hole having a width approximately one-third the width of said resilient cushion.

3. A universal extractor tool as set forth in claim 1 having first and second sleeves of non-metallic material, said first sleeve surrounding one leg of said first U-shaped member and an adjacent leg of said second U-shaped member and said second sleeve surrounding the other legs of said first and second U-shaped members.

* * * * *